(12) United States Patent
Cha et al.

(10) Patent No.: US 12,136,610 B2
(45) Date of Patent: Nov. 5, 2024

(54) UNIT PIXEL AND DISPLAYING APPARATUS INCLUDING THE UNIT PIXEL

(71) Applicant: SEOUL VIOSYS CO., LTD., Gyeonggi-do (KR)

(72) Inventors: Namgoo Cha, Gyeonggi-do (KR); Sang Min Kim, Gyeonggi-do (KR); Seongchan Park, Gyeonggi-do (KR); Yeonkyu Park, Gyeonggi-do (KR); Jae Hee Lim, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 185 days.

(21) Appl. No.: 17/526,306

(22) Filed: Nov. 15, 2021

(65) Prior Publication Data
US 2022/0173080 A1   Jun. 2, 2022

Related U.S. Application Data

(60) Provisional application No. 63/249,754, filed on Sep. 29, 2021, provisional application No. 63/119,364, filed on Nov. 30, 2020.

(51) Int. Cl.
*H01L 25/075* (2006.01)
*H01L 33/10* (2010.01)
(Continued)

(52) U.S. Cl.
CPC .......... *H01L 25/0753* (2013.01); *H01L 33/10* (2013.01); *H01L 33/46* (2013.01);
(Continued)

(58) Field of Classification Search
None
See application file for complete search history.

(56) References Cited

U.S. PATENT DOCUMENTS

| 6,753,915 B1 * | 6/2004 | Mochizuki | ........ H01L 27/14643 |
| | | | 257/292 |
| 2014/0367711 A1 * | 12/2014 | Bibl | ........ H01L 24/24 |
| | | | 257/89 |

(Continued)

FOREIGN PATENT DOCUMENTS

| EP | 3547376 A1 | 10/2019 |
| EP | 3690944 A1 | 8/2020 |

(Continued)

OTHER PUBLICATIONS

International Search Report issued in corresponding International Application No. PCT/KR2021/017885, mailed Mar. 23, 2022, English Translation, 2 pages.
(Continued)

*Primary Examiner* — Feifei Yeung Lopez
(74) *Attorney, Agent, or Firm* — LaBatt, LLC

(57) ABSTRACT

A unit pixel and a displaying apparatus including the unit pixel are provided. The unit pixel includes a transparent substrate, a plurality of light emitting devices arranged on the transparent substrate, a light blocking layer disposed between the transparent substrate and the light emitting devices, and having at least one window, and a semi-transmissive layer disposed between at least one of the plurality of light emitting devices and the transparent substrate to overlap with the window at least partially.

20 Claims, 18 Drawing Sheets

(51) Int. Cl.
*H01L 33/46* (2010.01)
*H01L 33/58* (2010.01)
*H01L 33/60* (2010.01)
*H01L 33/62* (2010.01)

(52) U.S. Cl.
CPC .............. *H01L 33/58* (2013.01); *H01L 33/60* (2013.01); *H01L 33/62* (2013.01)

(56) References Cited

U.S. PATENT DOCUMENTS

| | | | |
|---|---|---|---|
| 2019/0041701 A1* | 2/2019 | Chen | G02F 1/133617 |
| 2019/0067256 A1 | 2/2019 | Kurimoto | |
| 2019/0067526 A1* | 2/2019 | Kim | H01L 33/46 |
| 2019/0189595 A1 | 6/2019 | Lee et al. | |
| 2019/0326349 A1* | 10/2019 | Kwon | H01L 33/44 |
| 2020/0313056 A1 | 10/2020 | Hong | |
| 2021/0020619 A1* | 1/2021 | Iguchi | H01L 33/405 |
| 2021/0126161 A1* | 4/2021 | Monavarian | H01L 33/0075 |
| 2021/0273142 A1* | 9/2021 | Kang | G06F 1/1656 |
| 2022/0115563 A1* | 4/2022 | He | H01L 33/0095 |

FOREIGN PATENT DOCUMENTS

| | | |
|---|---|---|
| JP | 2016066374 A | 4/2016 |
| KR | 1020080046403 A | 5/2008 |
| KR | 1020150086759 A | 7/2015 |
| KR | 1020150138903 A | 12/2015 |
| KR | 1020200014159 A | 2/2020 |
| WO | 2017007770 A2 | 1/2017 |
| WO | WO2020027369 A1 * | 2/2020 |

OTHER PUBLICATIONS

Extended European Search Report for European Patent Application No. 21898748.5, Sep. 9, 2024, 9 pages.

* cited by examiner

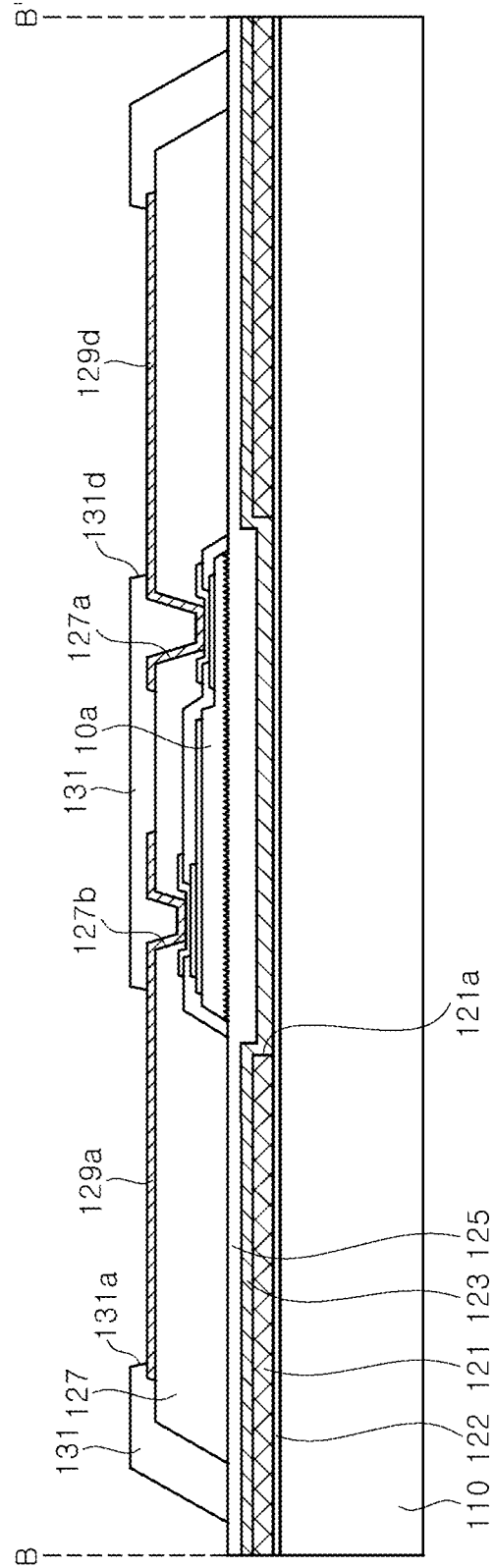

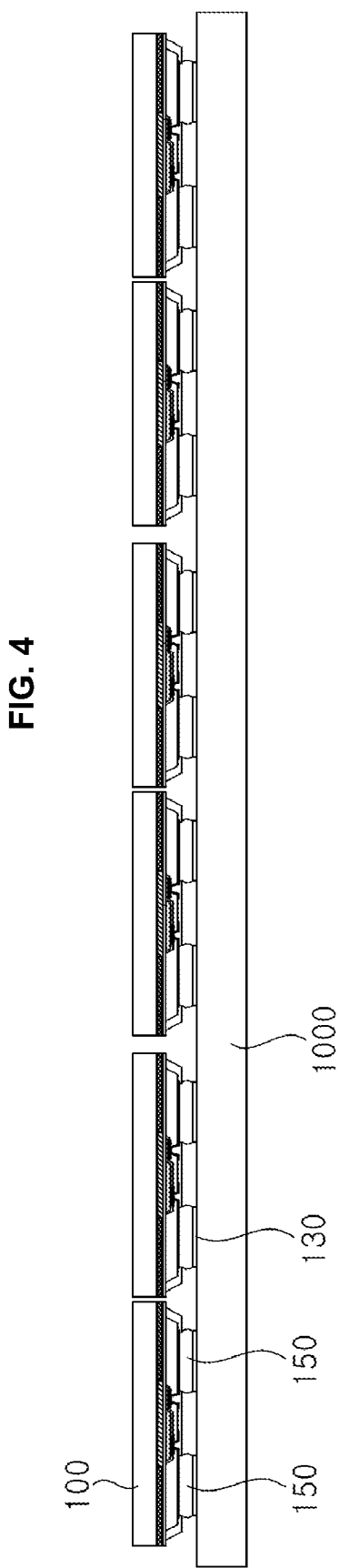

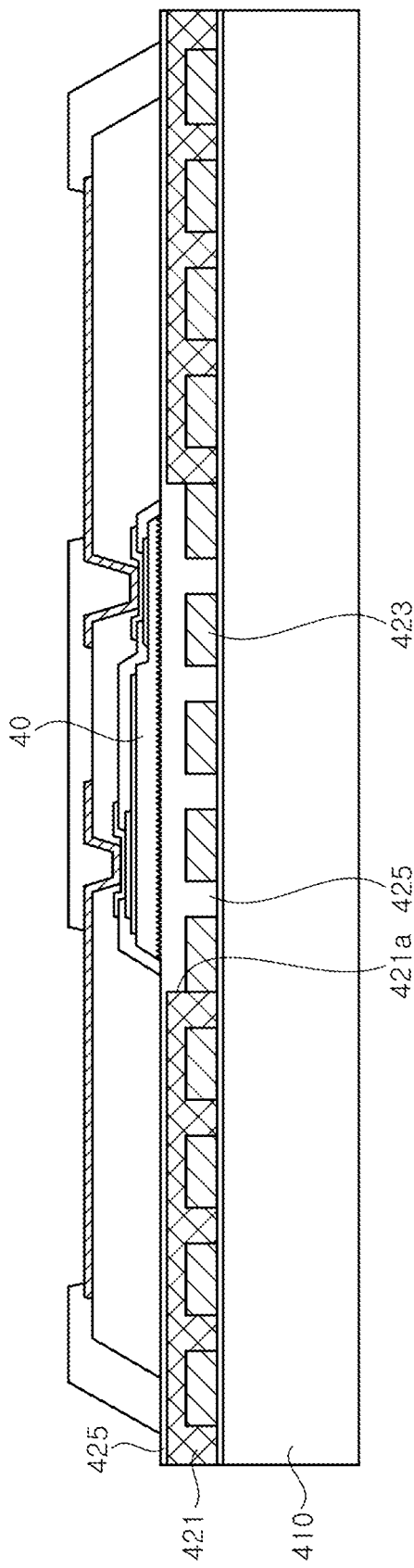

UNIT PIXEL AND DISPLAYING APPARATUS INCLUDING THE UNIT PIXEL

CROSS-REFERENCE OF RELATED APPLICATIONS AND PRIORITY

The present application claims priority to and benefit of U.S. Provisional Application Nos. 63/119,364 filed Nov. 30, 2020 and 63/249,754 filed Sep. 29, 2021, the disclosure of which are incorporated by reference as if they are fully set forth herein.

TECHNICAL FIELD

The present disclosure relates to a unit pixel and a displaying apparatus having the same, and more particularly, to a unit pixel including a light emitting diode and a displaying apparatus having the unit pixel.

BACKGROUND

Light emitting diodes are semiconductor devices using a light emitting diode which is an inorganic light source and are used in various fields such as displaying apparatuses, vehicle lamps, and general lightings. As the light emitting diodes have advantages such as long lifespan, low power consumption, and quick response, the light emitting diodes have been replacing conventional light sources.

Conventional light emitting diodes have been generally used as backlight light sources in displaying apparatuses. Recently, displaying apparatuses that directly realize images using the light emitting diodes have been developed. Such displays are also referred to as micro LED displays.

The displaying apparatus generally implements various colors using a mixed color of blue, green, and red, includes a plurality of pixels to implement various images, and each pixel has blue, green, and red sub-pixels. As such, a color of a certain pixel is typically determined based on the colors of the sub-pixels, so that images can be displayed through the combination of such pixels.

In a case of the micro LED display, micro LEDs are arranged on a plane corresponding to each sub pixel, and a large number of micro LEDs are mounted on a single substrate. However, the micro LED is extremely small, for example, 200 um or less, further 100 um or less, and these small sizes may cause certain restrictions. For instance, it is difficult to directly mount the light emitting diodes on a display panel due to handling the micro LEDs having small sizes. Furthermore, viewing angles of light emitted from the sub-pixels are different from one another and mixing of light may not be uniform and thus, colors may be different depending on an angle at which a user sees an image.

SUMMARY

Exemplary embodiments provide a unit pixel suitable for being mounted on a circuit board and a displaying apparatus having the same.

In addition, exemplary embodiments provide a unit pixel capable of mitigating a color difference depending on a viewing angle by adjusting a light pattern of light emitting devices, and a displaying apparatus having the same. In the exemplary embodiments, a micro LED light pattern depending on the viewing angle may not deteriorate as its size decreases. Therefore, so as to implement a displaying apparatus using a smaller-sized micro LED, the exemplary embodiments provides a technique for improving a light pattern depending on the viewing angle of the micro LED.

A unit pixel according to an exemplary embodiment of the present disclosure includes a transparent substrate; a plurality of light emitting devices arranged on the transparent substrate; a light blocking layer disposed between the transparent substrate and the light emitting devices, and having at least one window; and a semi-transmissive layer disposed between at least one of the plurality of light emitting devices and the transparent substrate to overlap the window at least partially.

As used herein, the term "semi-transmissive layer" refers to a transmissive layer having a transmittance of 70% or less and 30% or more with respect to light vertically incident from a corresponding light emitting device. The semi-transmissive layer may have a reflectance of 30% or more and 70% or less with respect to light vertically incident. In an exemplary embodiment, the semi-transmissive layer may have a transmittance of 50% or less with respect to light emitted from a corresponding light emitting device and vertically incident.

In an exemplary embodiment, the semi-transmissive layer may extend from the window to cover at least a portion of an upper surface of the light blocking layer.

Furthermore, the semi-transmissive layer located in the window may be located lower than the upper surface of the light blocking layer. The semi-transmissive layer may have a thickness smaller than that of the light blocking layer.

In another exemplary embodiment, the semi-transmissive layer may be disposed between the transparent substrate and the light blocking layer.

The semi-transmissive layer may have an island pattern shape or a grid pattern shape.

In an exemplary embodiment, the semi-transmissive layer may include a distributed Bragg reflector in which material layers having different refractive indices are alternately disposed.

In an exemplary embodiment, the distributed Bragg reflector may have a transmittance of light incident at an incident angle of 0° smaller than that of light incident at an incident angle greater than 0°.

The plurality of light emitting devices may include at least three light emitting devices emitting light of different colors from one another.

The unit pixel may further include a step adjustment layer at least partially covering the plurality of light emitting devices, and having openings exposing the plurality of light emitting devices.

Meanwhile, each of the plurality of light emitting devices may include a light emitting structure including a first conductivity type semiconductor layer, a second conductivity type semiconductor layer, and an active layer interposed between the first and second conductivity type semiconductor layers, and a first electrode pad and a second electrode pad disposed on the light emitting structure.

Furthermore, each of the light emitting devices may further include an insulation layer disposed between the light emitting structure and the first and second electrode pads, and the insulation layer may include a first distributed Bragg reflector. The semi-transmissive layer may include a second distributed Bragg reflector, and the second distributed Bragg reflector may have a thickness smaller than that of the first distributed Bragg reflector.

A plurality of windows may be formed in the light blocking layer corresponding to the plurality of light emitting devices.

Furthermore, the semi-transmissive layer may be spaced apart from at least one of the plurality of windows in a lateral direction.

A displaying apparatus according to an exemplary embodiment of the present disclosure may include a circuit board having pads, a plurality of unit pixels disposed on the circuit board, and bonding materials for bonding the unit pixels to the pads. Each of the unit pixels may include a transparent substrate; a plurality of light emitting devices arranged on the transparent substrate; a light blocking layer disposed between the transparent substrate and the light emitting devices, and having at least one window; and a semi-transmissive layer disposed between at least one of the plurality of light emitting devices and the transparent substrate to overlap with the window at least partially.

In an exemplary embodiment, the semi-transmissive layer may extend from the window to cover at least a portion of an upper surface of the light blocking layer.

In another exemplary embodiment, the semi-transmissive layer may be disposed between the transparent substrate and the light blocking layer.

According to one or more embodiments of the present disclosure, a unit pixel includes a transparent substrate, a plurality of light emitting devices disposed on the transparent substrate, a light blocking structure disposed between the transparent substrate and the light emitting devices and having at least one window, and a semi-transmissive structure disposed between at least one of the plurality of light emitting devices and the transparent substrate. The semi-transmissive structure arranged to overlap with at least a part of the window.

In at least one variant, the semi-transmissive structure extends from the window and is arranged to cover at least a portion of an upper surface of the light blocking structure.

In another variant, the semi-transmissive structure includes a first part arranged in the window. The first part is located lower than an upper surface of the light blocking structure relative to the transparent substrate.

In another variant, the semi-transmissive structure further includes a layer disposed between the transparent substrate and the light blocking layer. In further another variant, the semi-transmissive structure further includes one or more island patterns. In further another variant, the semi-transmissive structure further includes one or more grid patterns.

In another variant, the semi-transmissive structure is disposed between the transparent substrate and a corresponding light emitting device among the plurality of light emitting devices. A transmittance of the semi-transmissive structure is 70% or less with respect to light emitted from the corresponding light emitting device and vertically incident on the semi-transmissive structure. In further another variant, the transmittance of the semi-transmissive structure is 50% or less with respect to light emitted from the corresponding light emitting device and vertically incident on the semi-transmissive structure.

In another variant, the semi-transmissive structure includes a distributed Bragg reflector in which material layers having different refractive indices are alternately disposed.

In another variant, the distributed Bragg reflector has a first transmittance of light incident at an incident angle of 0° and a second transmittance of light incident at an incident angle greater than 0°, the first transmittance being smaller than the second transmittance.

In another variant, the plurality of light emitting devices includes at least three light emitting devices emitting light of different colors from one another.

In another variant, a step adjustment layer at least partially covers the plurality of light emitting devices and has openings exposing the plurality of light emitting devices.

In another variant, each of the light emitting devices includes a light emitting structure including (i) a semiconductor stack including a first conductivity type semiconductor layer, a second conductivity type semiconductor layer, and an active layer interposed between the first conductivity type semiconductor layer and the second conductivity type semiconductor layer, and (ii) a first electrode pad and a second electrode pad disposed on the light emitting structure.

According to one or more embodiments of the present disclosure, a unit pixel, a transparent substrate, a plurality of light emitting devices disposed on the transparent substrate, a light emitting device comprising a light emitting structure and an electrode pad, a light blocking structure disposed between the transparent substrate and the light emitting devices and having at least one window, a semi-transmissive structure disposed between at least one of the plurality of light emitting devices and the transparent substrate, the semi-transmissive structure arranged to overlap with at least a part of the window, and an insulation layer disposed between the light emitting structure and the electrode pad. The insulation layer includes a first distributed Bragg reflector and the semi-transmissive structure includes a second distributed Bragg reflector.

In at least one variant, the second distributed Bragg reflector has a thickness smaller than a thickness of the first distributed Bragg reflector.

In another variant, a plurality of windows is formed in the light blocking layer corresponding to one or more of the plurality of light emitting devices.

In further another variant, the plurality of windows is arranged side by side and spaced apart from one another such that the semi-transmissive structure arranged in each of the plurality of windows is spaced apart along with the plurality of windows.

According to one or more embodiments of the present disclosure, a displaying apparatus includes a circuit board having pads, a plurality of unit pixels disposed on the circuit board, and bonding materials for bonding the plurality of unit pixels to the pads. Each of the unit pixels includes a transparent substrate, a plurality of light emitting devices disposed on the transparent substrate, a light blocking layer disposed between the transparent substrate and the light emitting devices, and having at least one window, and a semi-transmissive structure disposed between at least one of the plurality of light emitting devices and the transparent substrate. The semi-transmissive structure at least partially overlaps with the window.

In at least one variant, the semi-transmissive structure further comprises a layer that extends from the window to cover at least a portion of an upper surface of the light blocking layer. The semi-transmissive structure is disposed between the transparent substrate and the light blocking layer.

DESCRIPTION OF DRAWINGS

FIG. 3C is a schematic cross-sectional view taken along line B-B' of FIG. 3A.

FIG. 4 is a cross-sectional view illustrating a displaying apparatus according to an exemplary embodiment.

FIG. 6C illustrates islands having circular shape;

FIG. 6D illustrates islands having triangular shape; and

FIG. 6E illustrates islands having radial shape.

FIG. 7A is a schematic cross-sectional view illustrating a unit pixel according to another exemplary embodiment.

DETAILED DESCRIPTION OF EMBODIMENTS

Figure 1:
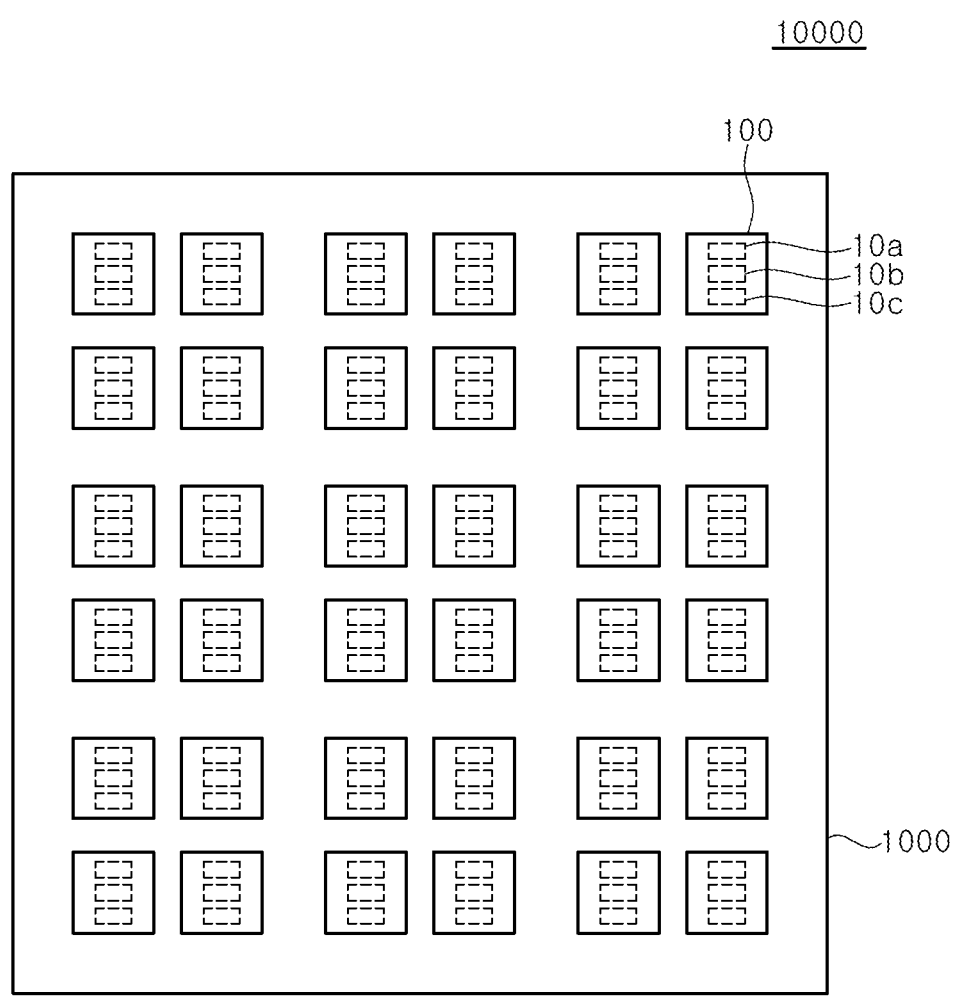
FIG. 1 is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

FIG. 1 is a plan view illustrating a displaying apparatus 10000 according to an exemplary embodiment.

Referring to FIG. 1, the displaying apparatus 10000 may include a panel substrate 1000 and a plurality of unit pixels 100.

The displaying apparatus 10000 is not particularly limited to, but it may include a VR displaying apparatus such as a micro LED TV, a smart watch, a VR headset, or an AR displaying apparatus such as augmented reality glasses.

The panel substrate 1000 may be formed of a material such as polyimide (PI), FR-4 glass epoxy (FR4), glass, or the like, and may include a circuit for passive matrix driving or active matrix driving. In an exemplary embodiment, the panel substrate 1000 may include wirings and resistors therein, and, in another exemplary embodiment, the panel substrate 1000 may include wirings, transistors, and capacitors. In addition, the panel substrate 1000 may have pads on an upper surface thereof, which allow electrical connection to the internal circuit.

The plurality of unit pixels 100 may be arranged on the panel substrate 1000. The plurality of unit pixels 100 may be arranged in 6×6 as illustrated in FIG. 1, but the inventive concepts are not limited thereto, and may be arranged in various matrices (n×m, n=1, 2, 3, 4 . . . ; m=1, 2, 3, 4 . . . ), such as 2×2, 3×3, 5×5, or the like.

Each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a predetermined pattern, as illustrated in FIG. 1. In an exemplary embodiment, the light emitting devices 10a, 10b, and 10c may be arranged in a vertical direction with respect to a display screen on which an image is displayed. However, the inventive concepts are not limited thereto, and the light emitting devices 10a, 10b, and 10c may be arranged in a lateral direction with respect to the display screen on which the image is displayed.

Hereinafter, each element of the displaying apparatus 10000 will be described in detail in the order of the light emitting devices 10a, 10b, 10c and the unit pixel 100 disposed in the displaying apparatus 10000.

Figure 2A:
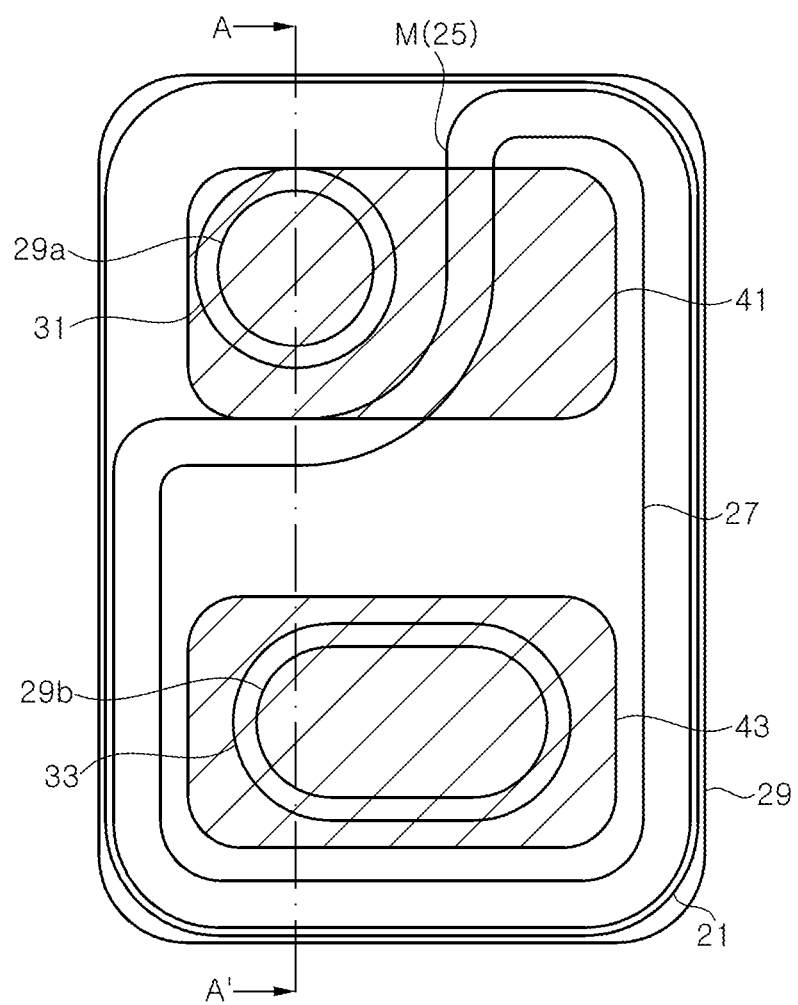
FIG. 2A is a schematic plan view illustrating a light emitting device according to an exemplary embodiment.
Figure 2B:
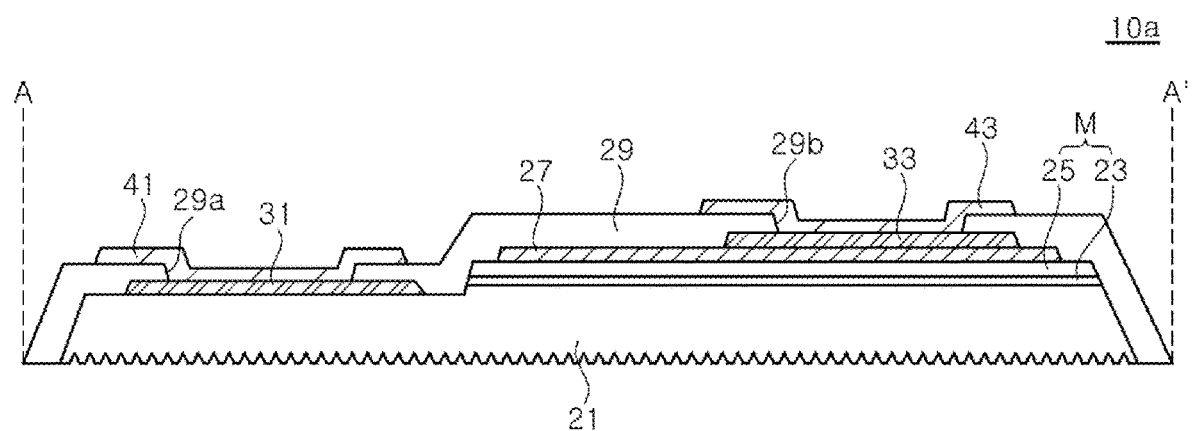
FIG. 2B is a schematic cross-sectional view taken along line A-A' of FIG. 2A.

FIGS. 2A and 2B are a plan view and a cross-sectional view illustrating a light emitting device 10a according to an exemplary embodiment of the present disclosure, respectively.

Referring to FIGS. 2A and 2B, the light emitting device 10a includes a light emitting structure including a first conductivity type semiconductor layer 21, an active layer 23, and a second conductivity type semiconductor layer 25. In addition, the light emitting device 10 may include an ohmic contact layer 27, an insulation layer 29, a first contact pad 31, a second contact pad 33, a first electrode pad 41, and a second electrode pad 43.

The first conductivity type semiconductor layer 21, the active layer 23, and the second conductivity type semiconductor layer 25 may be grown on a growth substrate (not shown). The substrate may be one of various substrates that are used to grow semiconductors, such as a gallium nitride substrate, a GaAs substrate, a Si substrate, a sapphire substrate, especially a patterned sapphire substrate. After the growth of the semiconductor layers is completed, the growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

In the illustrated exemplary embodiment, the plurality of light emitting devices 10a, 10b, and 10c may emit red light, green light, and blue light, respectively. In the exemplary embodiment, although the red light emitting device 10a, the green light emitting device 10b, and the blue light emitting device 10c are shown as being arranged in the order, the present disclosure is not necessarily limited thereto.

Meanwhile, in a case of the light emitting device 10a emitting red light, the semiconductor layers may include aluminum gallium arsenide (AlGaAs), gallium arsenide phosphide (GaAsP), aluminum gallium indium phosphide (AlGaInP), and gallium phosphide (GaP).

In a case of the light emitting device 10b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In a case of the light emitting device 10c emitting blue light, the semiconductor layers may include gallium nitride (GaN), indium gallium nitride (InGaN), or zinc selenide (ZnSe).

The first conductivity type semiconductor layer 21, the active layer 23, and the second conductivity type semiconductor layer 25 may be grown on the substrate in a chamber using a process such as a Metal Organic Chemical Vapor Deposition (MOCVD) process. In addition, the first conductivity type semiconductor layer 21 may include n-type impurities such as Si, Ge, and Sn, and the second conductivity type semiconductor layer 25 may include p-type impurities such as Mg, Sr, and Ba. For example, the first conductivity type semiconductor layer 21 may include GaN or AlGaN containing Si as a dopant, and the second conductivity type semiconductor layer 25 may include GaN or AlGaN containing Mg as a dopant.

Referring back to FIG. 2B, although the first conductivity type semiconductor layer 21 and the second conductivity type semiconductor layer 25 are shown as single layers in the drawings, these layers may be multiple layers, and may also include a superlattice layer. The active layer 23 may include a single quantum well structure or a multiple quantum well structure, and a composition ratio of a Nitride-based semiconductor may be adjusted to emit a desired wavelength. For example, the active layer 23 may emit red light, green light, blue light, or ultraviolet light depending on a semiconductor material constituting the layer and a composition ratio thereof.

The second conductivity type semiconductor layer 25 and the active layer 23 may have a mesa M structure and may be disposed on the first conductivity type semiconductor layer 21. The mesa M may include the active layer 23 and the second conductivity type semiconductor layer 25. In addition, the mesa M may include at least a portion of the first conductivity type semiconductor layer 21. The mesa M may be located on a partial region of the first conductivity type semiconductor layer 21, and an upper surface of the first conductivity type semiconductor layer 21 may be exposed around the mesa M.

In an exemplary embodiment of the present disclosure, the light emitting device 10 may be formed by separating the growth substrate, and thus, the first conductivity type semiconductor layer 21 may be exposed on a lower surface of the light emitting device 10. The first conductivity type semiconductor layer 21 may have a concave-convex pattern through surface texturing as shown in FIG. 2B, but the inventive concepts are not limited thereto, and may have a flat surface. The concave-convex pattern may be formed through surface texturing using a dry or wet etching process.

The ohmic contact layer 27 may be in ohmic contact with the second conductivity type semiconductor layer 25 and disposed on the second conductivity type semiconductor layer 25. The ohmic contact layer 27 may be formed as a single layer or multiple layers. The ohmic contact layer 27 may be formed of a transparent conductive oxide film or a metal film. For example, the transparent conductive oxide layer may include ITO or ZnO, and the metal layer may include metals such as Al, Ti, Cr, Ni and Au, and alloys thereof.

The first contact pad 31 may be disposed on the exposed first conductivity type semiconductor layer 21 in which the mesa M is not formed. The first contact pad 31 may be in ohmic contact with the first conductivity type semiconductor layer 21. The first contact pad 31 may be formed of an ohmic metal layer in ohmic contact with the first conductivity type semiconductor layer 21. The ohmic metal layer of the first contact pad 31 may be appropriately selected depending on a semiconductor material of the first conductivity type semiconductor layer 21.

The second contact pad 33 may be disposed on the ohmic contact layer 27. The second contact pad 33 may be electrically connected to the ohmic contact layer 27.

The insulation layer 29 may cover at least portions of the first conductivity type semiconductor layer 21, the active layer 23, the second conductivity type semiconductor layer 25, the first contact pad 31, and the second contact pad 33. In an exemplary embodiment of the present disclosure, the insulation layer 29 may be formed to cover almost an entire surface of the light emitting device 10a, except for a portion of the second contact pad 33 and a portion of the first contact pad 31. That is, the insulation layer 29 may have a first opening 29a and a second opening 29b exposing the first contact pad 31 and the second contact pad 33. The insulation layer 29 may be formed of a distributed Bragg reflector in which insulation layers having different refractive indices from one another are stacked, and the distributed Bragg reflector may be formed by alternately stacking at least two insulation layers selected from $SiO_2$, $TiO_2$, $Nb_2O_5$, $Si_3N_4$, SiON, $Ta_2O_5$, and the like.

The distributed Bragg reflector may reflect light emitted from the active layer 23, and in this case, the distributed Bragg reflector may be formed to exhibit high reflectance over a relatively wide wavelength range including a peak wavelength of light emitted from the active layer 23. In addition, if necessary, it may be designed in consideration of an incident angle of light. Through this, the distributed Bragg reflector may reflect light generated in the active layer 23 to emit light through the first conductivity type semiconductor layer 21 exposed by removing the growth substrate.

The light emitting device 10c emitting blue light may have higher internal quantum efficiency than those of the light emitting devices 10a and 10b emitting red light and green light. Accordingly, the light emitting device 10c emitting blue light may exhibit higher light extraction efficiency than those of the light emitting devices 10a and 10b emitting red light and green light. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. Specifically, the light emitting device 10c emitting blue light may have the distributed Bragg reflector having a relatively low reflectance compared to those of the light emitting devices 10a and 10c emitting red light and green light.

In an exemplary embodiment, the distributed Bragg reflectors applied to the red, green, and blue light emitting devices 10a, 10b, and 10c may have substantially similar thicknesses. By setting the distributed Bragg reflectors to have similar thicknesses, process conditions applied to the respective light emitting devices 10a, 10b, and 10c emitting red light, green light, and blue light may be similarly set. Specifically, a process of patterning the insulation layer 29 may be set similarly, and the distributed Bragg reflectors may have a similar number of stacks. However, the inventive concepts are not limited thereto.

The first electrode pad 41 and the second electrode pad 43 may be disposed on the insulation layer 29. The first electrode pad 41 may extend from an upper portion of the first contact pad 31 to an upper portion of the ohmic contact layer 27 with the insulation layer 29 interposed therebetween. The second electrode pad 43 may be disposed in the upper region of the ohmic contact layer 27. In more detail, the second electrode pad 43 may extend from an upper portion of the second contact pad 33 to the upper portion of the ohmic contact layer 27 with the insulation layer 29 interposed therebetween. The first electrode pad 41 may be electrically connected to the first contact pad 31 through the first opening 29a of the insulation layer 29, and may be directly in contact with the first conductivity type semiconductor layer 21 if necessary. In this case, the first contact pad 31 may be omitted. The second electrode pad 43 may be electrically connected to the second contact pad 33 through the second opening 29b of the insulation layer 29. In other forms, the second electrode pad 43 may be directly in contact with the ohmic contact layer 27, and the second contact pad 33 may be omitted.

Although the light emitting devices 10a, 10b, and 10c according to the exemplary embodiment have been briefly described, the light emitting devices 10a, 10b, and 10c may further include a layer having additional functions in addition to the above-described layers. For example, various layers such as a reflection layer for reflecting light, an additional insulation layer for insulating a specific element, and a solder preventing layer for preventing diffusion of solder may be included in the light emitting devices 10a, 10b, and 10c.

Figure 3A:
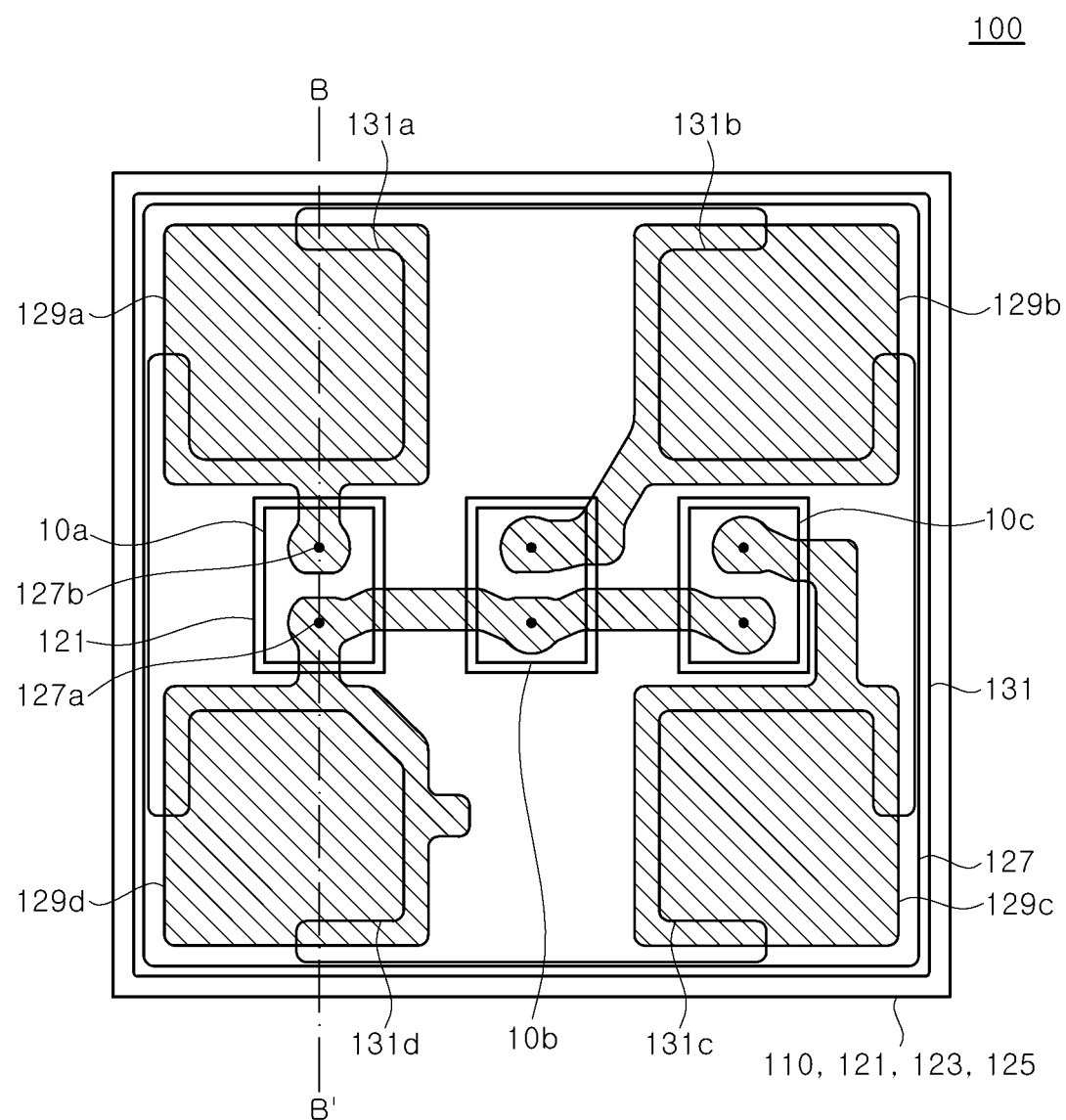
FIG. 3A is a schematic plan view illustrating a unit pixel according to an exemplary embodiment.
Figure 3B:
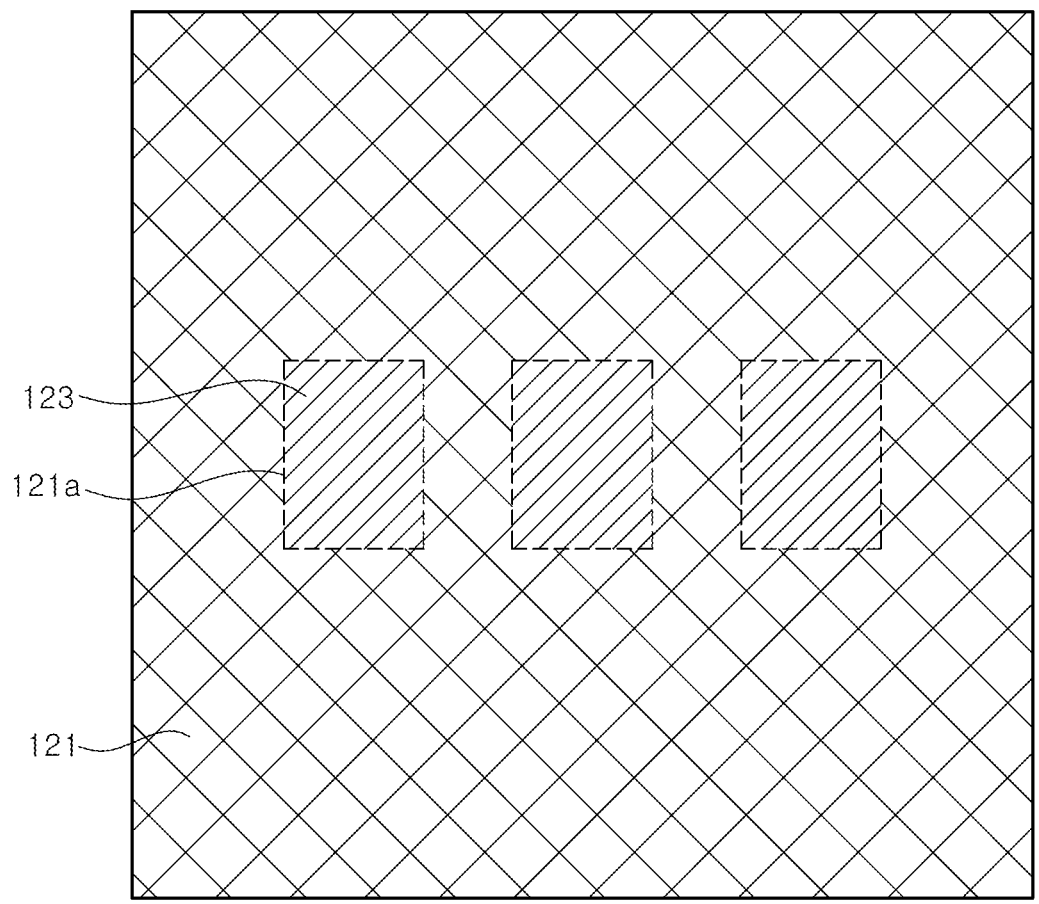
FIG. 3B is a schematic rear view illustrating a unit pixel according to an exemplary embodiment.

FIG. 3A is a schematic plan view illustrating a unit pixel according to an exemplary embodiment, FIG. 3B is a schematic rear view illustrating a unit pixel according to an exemplary embodiment, and FIG. 3C is a schematic cross-sectional view taken along line B-B' of FIG. 3A.

Referring to FIGS. 3A, 3B, and 3C, a unit pixel 100 may include a transparent substrate 110, light emitting devices 10a, 10b, and 10c, a light blocking layer 121, and a semi-transmissive structure 123. In some forms, the semi-transmissive structure 123 includes a semi-transmissive layer. In other forms, the semi-transmissive structure 123 includes structures having various patterns, such as island patterns, grid patterns, triangular patterns, circular patterns, swirl patterns, spiraling patterns, etc. as shown in FIGS. 6B through 6E. The unit pixel 100 may also include an adhesive layer 125, a step adjustment layer 127, connection layers 129a, 129b, 129c, and 129d, and an insulation material layer 131, and may further include a surface layer 122.

The unit pixel 100 may include at least three light emitting devices 10a, 10b, and 10c. The plurality of light emitting devices 10a, 10b, and 10c may emit light of different colors from one another. The plurality of light emitting devices 10a, 10b, and 10c may emit red light, green light, and blue light, respectively. For example, a peak wavelength of the red light may be 600 nm to 670 nm. A peak wavelength of the green light may be 500 nm to 590 nm. A peak wavelength of the blue light may be 430 nm to 490 nm. Since the light emitting devices 10a, 10b, and 10c are the same as those described with reference to FIGS. 2A and 2B, a detailed description thereof will be omitted. The light emitting devices 10a, 10b, and 10c are disposed on the transparent substrate 110.

The transparent substrate 110 may be a light transmissive substrate such as PET, glass substrate, quartz, sapphire substrate, or the like. The transparent substrate 110 may be disposed on a light exiting surface of the displaying apparatus 10000, and light generated from the light emitting device 10 may be emitted to the outside through the transparent substrate 110. The transparent substrate 110 may have an upper surface that is a light exiting surface and have a lower surface adjacent to the light emitting device 10. The transparent substrate 110 may have a flat lower surface of the transparent substrate 110 facing the light emitting device 10, but the inventive concepts are not limited thereto, and the transparent substrate 110 may be configured to form a concave-convex pattern on the lower surface facing the light emitting device 10.

The transparent substrate 110 may include an anti-reflection coating on the upper surface that is the light exiting surface, or may include an anti-glare layer. By way of example, the transparent substrate 110 may have a thickness of about 50 um to about 300 um.

Since the transparent substrate 110 is disposed on the light exiting surface in the exemplary embodiment, the transparent substrate 110 does not include a circuit. However, the inventive concepts are not limited thereto, and, in some exemplary embodiments, the transparent substrate 121 may include the circuit.

In addition, in the illustrated exemplary embodiment, one unit pixel 100 is illustrated and described as being formed on one transparent substrate 110, but the inventive concepts are not limited thereto, and a plurality of unit pixels 100 may be formed on one transparent substrate 110.

A surface layer 122 may be disposed between the transparent substrate 110 and the light blocking layer 121. The surface layer 122 may be formed to improve adhesion between the light blocking layer 121 and the transparent substrate 110. The surface layer 122 may be formed of, for example, a silicon oxide film ($SiO_2$). The surface layer 122 may be omitted depending on types of the transparent substrate 110 and the light blocking layer 121.

The light blocking layer 121 is disposed between the transparent substrate 110 and the light emitting devices 10a, 10b, and 10c. The light blocking layer 121 may be composed of an inorganic material or an organic material, and may be formed in a black color by adding a dye such as carbon. For example, the light blocking layer 121 may include a material that absorbs light such as a black matrix. The light absorbing material may prevent light generated in the plurality of light emitting devices 10a, 10b, and 10c from being emitted to an undesired region, thereby improving contrast of the displaying apparatus.

The light blocking layer 121 may have a plurality of windows 121a on a path of light so that light generated in the light emitting devices 10a, 10b, and 10c is incident on the transparent substrate 110. In an exemplary embodiment, the windows 121a may be defined as regions in which portions of the light blocking layer 121 are open. The windows 121a may at least partially overlap the light emitting devices 10a, 10b, and 10c in a vertical direction. In addition, a width of the window 121a may be wider than that of the corresponding light emitting devices 10a, 10b, and 10c, but the inventive concepts are not limited thereto, but may be smaller than or equal to that of the corresponding light emitting devices 10a, 10b, and 10c.

When the windows 121a overlap the light emitting devices 10a, 10b, and 10c in the vertical direction, the windows 121a may define locations of the light emitting devices 10a, 10b, and 10c. A plurality of windows 123a may be disposed corresponding to the light emitting devices 10a, 10b, and 10c. Since the locations of the light emitting devices 10a, 10b, and 10c are defined by the windows 121a, separate arrangement markers for arranging the light emitting devices 10a, 10b, and 10c may be omitted. However, the inventive concepts are not limited thereto, and an arrangement marker may be provided to arrange the light emitting devices 10a, 10b, and 10c on the transparent substrate 110. The arrangement marker may be formed of, for example, the transparent substrate 110, the light blocking layer 121, the semi-transmissive layer 123, or the adhesive layer 125, or a separate layer for generating the arrangement marker may be formed on the transparent substrate 110, the light blocking layer 121, the semi-transmissive layer 123, or the adhesive layer 125.

In the illustrated exemplary embodiment, although it is illustrated and described that the plurality of windows 121a is formed to correspond to the light emitting devices 10a, 10b, and 10c, the inventive concepts are not limited thereto. For example, a single window 121a may be provided on the light blocking layer 121, and a plurality of light emitting devices 10a, 10b, and 10c may be disposed to overlap the single window 121a in the vertical direction.

The light blocking layer 121 may have a thickness of, for example, about 0.5 um to about 2 um, specifically may have a thickness of about 0.5 um to about 1.5 um, and more specifically, may have a thickness of about 0.5 um to about 1 um. When the thickness of the light blocking layer 121 is as small as 0.5 um or less, it is difficult to achieve the function of blocking light, and when the thickness of the light blocking layer 121 is 2 um or more, the unit pixel 100 becomes thick, and production cost may increase as an amount of material used increases.

The semi-transmissive layer 123 may be formed at least at a location corresponding to the windows 121a, and may be formed to extend from the windows 121a to side and upper surfaces of the light blocking layer 121 if necessary. In an exemplary embodiment, the semi-transmissive structure 123 includes the semi-transmissive layer 123 formed in the windows 121a. The semi-transmissive layer 123 may be located lower than an upper surface of the light blocking layer 121. The semi-transmissive layer 123 may be formed on the light blocking layer 121, and may be formed along a cross-sectional shape of the light blocking layer 121.

Referring to FIG. 3C, the semi-transmissive layer 123 may be formed on the light blocking layer 121 to cover the light blocking layer 121. The semi-transmissive layer 121 may contact the transparent substrate 110 or the surface layer 122 in the windows 121a.

The semi-transmissive layer 123 transmits a portion of light emitted from the light emitting devices 10a, 10b, and 10c. The semi-transmissive layer 123 has a transmittance of about 70% or less, and further, about 50% or less. Transmittance of the semi-transmissive layer 123 may be adjusted in consideration of patterns of light emitted from the light emitting devices 10a, 10b, and 10c. The semi-transmissive layer 123 of the same material may cover the windows 121a corresponding to the light emitting devices 10a, 10b, and 10c, but the inventive concepts are not limited thereto. In consideration of the light emitting devices 10a, 10b, and 10c having different wavelengths of emitted light, different semi-transmissive layers 123 may cover the windows 121a, respectively.

In an exemplary embodiment, the semi-transmissive layer 123 may be formed of a material that partially absorbs light, such as a light absorption layer. In this case, the semi-transmissive layer 123 may absorb a portion of light emitted from the light emitting devices 10a, 10b, and 10c and transmit a portion thereof. As such, a favorable light pattern may be implemented by reducing an intensity of light emitted from the light emitting devices 10a, 10b, and 10c in the vertical direction.

In another exemplary embodiment, the semi-transmissive layer 123 may be formed of a distributed Bragg reflector in which materials having different refractive indices from one another are alternately stacked. By using the structure and properties of the distributed Bragg reflector, the transmittance of light transmitted in the vertical direction in a specific wavelength band may be adjusted to 70% or less, further to 50% or less, and most of remaining light may be reflected. Reflected light may be reflected back from the light emitting devices 10a, 10b, and 10c and then emitted through the transparent substrate 110 to the outside.

By adjusting parameters such as the material, a number of layers, the thickness of each layer and the thickness of layers as a whole, and the like in the structure of the distributed Bragg reflector, the transmittance of light emitted from the light emitting devices 10a, 10b, and 10c in the vertical direction may be reduced and thus, an amount of light emitted in the vertical direction may be reduced. Moreover, by adjusting the above-mentioned parameters relevant to the distributed Bragg reflector, it is possible to increase the transmittance of light incident at an angle of incidence greater than that of light incident at an incident angle of 0° in the vertical direction. As used herein, the "distributed Bragg reflector" has a reflectance that does not exceed 70%, and may be 50% or less. Meanwhile, the distributed Bragg reflector may have a reflectance of 30% or more. The distributed Bragg reflector uses optical interference by layers having different refractive indices from one another, which may be referred to as an interference filter.

In an exemplary embodiment, the distributed Bragg reflector has a small reflectance compared to that of the distributed Bragg reflector included in the insulation layer 29 of the light emitting devices 10a, 10b, 10c, and thus, may have a smaller number of layers and a smaller thickness than the one in the insulation layer 29.

The distributed Bragg reflector may reflect and transmit light emitted from the plurality of light emitting devices 10a, 10b, and 10c to change a light pattern depending on a viewing angle. In particular, as a size of the micro LED decreases, an amount of light emitted in the vertical direction tends to increase, but the amount of light in the vertical direction may be reduced by disposing the distributed Bragg reflector on the path of light.

In addition, a portion of light generated in the light emitting devices 10a, 10b, and 10c, after entering into the transparent substrate 110, may not be emitted to the outside due to total internal reflection on the surface of the transparent substrate 110. Light that is not emitted to the outside through the transparent substrate 110 may be reflected to the surface of the transparent substrate 110 by the semi-transmissive layer 123 and emitted to the outside, and thus, light extraction efficiency of the unit pixel 100 may be increased.

The distributed Bragg reflector may include at least two types of insulation layers selected from $SiO_2$, $TiO_2$, $Nb_2O_5$, $Si_3N_4$, SiON, $Ta_2O_5$, and the like, and these insulation layers may be alternately stacked.

In an exemplary embodiment, the distributed Bragg reflector may exhibit similar reflectance over a wide wavelength range including all of these wavelengths in consideration of respective peak wavelengths of light emitted from the plurality of light emitting devices 10a, 10b, and 10c, and may be designed in consideration of incident angle of light. However, the inventive concepts are not limited thereto, and the light emitting devices 10a, 10b, and 10c may be designed to exhibit different reflectances depending on the peak wavelengths. For example, the distributed Bragg reflector may be designed to have relatively low reflectance for relatively long wavelengths, e.g., red light, and may have relatively high reflectance for relatively short wavelengths, e.g., blue light.

A single distributed Bragg reflector may continuously cover the windows 121a, or distributed Bragg reflectors having same characteristics may be spaced apart from one another to cover the windows 121a, respectively. However, the inventive concepts are not limited thereto. The light emitting devices 10a, 10b, and 10c may have different light patterns depending on the viewing angles, and thus, the distributed Bragg reflectors designed differently corresponding to each of the light emitting devices 10a, 10b, and 10c may be placed in the respective windows 121a. By employing the distributed Bragg reflector, the light patterns depending on the viewing angles of the light emitting devices 10a, 10b, and 10c may be formed to have similar shapes to one another.

The adhesive layer 125 may be used to attach the light emitting devices 10a, 10b, and 10c to the transparent substrate 110. The adhesive layer 125 may be disposed on the transparent substrate 110, and may cover at least a portion of the light blocking layer 121 or the semi-transmissive layer 123. The adhesive layer 125 may be formed on an entire surface of the transparent substrate 110, but the inventive concepts are not limited thereto, and, in some exemplary embodiments, the adhesive layer 125 may be formed in a portion of the transparent substrate 110 to expose a region near an edge of the transparent substrate 121. The adhesive layer 125 may fill the windows 121a formed by the light blocking layer 121.

In some forms, the adhesive layer 125 may be formed of a light-transmitting material, and may transmit light emitted from the light emitting device 10. The adhesive layer 125 may be formed using an organic adhesive, and the adhesive layer 125 may be formed using a transparent epoxy, PDMS, or the like, for example. In addition, the adhesive layer 125 may include a diffuser such as $SiO_2$, $TiO_2$, ZnO, or the like to diffuse light. The diffuser in the adhesive layer diffuses light incident to and reflected from the light emitting device 10 through the adhesive layer and the transparent substrate 110. Thus, the light emitting device 10 may be prevented from being observed through the transparent substrate 110.

In the illustrated exemplary embodiment, the light emitting devices 10a, 10b, and 10c are attached to the transparent substrate 110 by the adhesive layer 125, but the inventive concepts are not limited thereto, and the light emitting devices 10a, 10b, and 10c may be coupled to the transparent substrate 110 using another coupling member instead of the adhesive layer 125. For example, the light emitting devices 10a, 10b, and 10c may be coupled to the transparent substrate 110 using a spacer. The spacer may be coated with an organic resin and may have a predetermined shape, generally a pillar or columnar shape. Accordingly, a gas or liquid may be filled in a region between the light emitting devices 10a, 10b, and 10c and the transparent substrate 110. An optical layer that transmits light emitted from the light emitting devices 10a, 10b, and 10c may be formed by gas or liquid.

The step adjustment layer 127 may cover at least a portion of the light emitting devices 10a, 10b, and 10c. The step adjustment layer 127 has first and second openings 127a and 127b exposing first and second electrode pads 41 and 43 of the light emitting devices 10a, 10b, and 10c, as shown in FIG. 3C. The step adjustment layer 127 may adjust to a height of a surface on which the connection layers 129a, 129b, 129c, and 129d are formed and may assist to safely form the connection layers 129a, 129b, 129c, and 129d. The step adjustment layer 127 may be formed of, for example, photosensitive polyimide.

The first, second, third, and fourth connection layers 129a, 129b, 129c, and 129d are electrically connected to the plurality of light emitting devices 10a, 10b, and 10c. The first, second, and third connection layers 129a, 129b, and 129c may be electrically connected to second conductivity type semiconductor layers 25 of the light emitting devices 10a, 10b, and 10c, respectively. The fourth connection layer 129d may be commonly electrically connected to first conductivity type semiconductor layer 21 of the plurality of light emitting devices 10a, 10b, and 10c, as shown in FIG. 3A. Specifically, the first, second, and third connection layers 129a, 129b, and 129c may be connected to the second electrode pad 43 of the plurality of light emitting devices 10a, 10b, and 10c through the second opening 127b of the step adjustment layer 127. In addition, the fourth connection layer 129d may be connected to the first electrode pad 41 of the plurality of light emitting devices 10a, 10b, and 10c through the first opening 127a of the step adjustment layer 127, as illustrated in FIG. 3C.

The first, second, third, and fourth connection layers 129a, 129b, 129c, and 129d may be formed together on the step adjustment layer 127, and may include, for example, Au. Although the first conductivity type semiconductor layers 21 of the light emitting devices 10a, 10b, and 10c are commonly electrically connected in the illustrated exemplary embodiment, the inventive concepts are not limited thereto. The second conductivity type semiconductor layers 25 of the light emitting devices 10a, 10b, and 10c may be commonly electrically connected, and the first conductivity type semiconductor layers 21 may be electrically spaced apart from one another.

The insulation material layer 131 may at least partially cover the step adjustment layer 127. The insulation material layer 131 may be formed to have a thickness smaller than that of the step adjustment layer 127. A sum of the thicknesses of the insulation material layer 131 and the step adjustment layer 127 may be about 1 um to about 50 um, but the inventive concepts are not limited thereto.

The insulation material layer 131 may cover side surfaces of the step adjustment layer 127 and at least a portion of the connection layers 129a, 129b, 129c, and 129d, as shown in FIG. 3A. The insulation material layer 131 has openings 131a, 131b, 131c, and 131d exposing the connection layers 129a, 129b, 129c, and 129d in FIG. 3A. The openings 131a, 131b, 131c, and 131d may be partially formed on the connection layers 129a, 129b, 129c, and 129d, but the inventive concepts are not limited thereto. As illustrated in FIG. 3A, the openings 131a, 131b, 131c, and 131d may have a shape open to the outside in regions adjacent to each corner of the transparent substrate 110. That is, the insulation material layer 131 may be formed to expose the side surfaces of the step adjustment layer 127 and the connection layers 129a, 129b, 129c, and 129d near the corners of the transparent substrate 110. As illustrated in FIG. 3A, the insulation material layer 131 may partially cover two side surfaces of each of the connection layers 129a, 129b, 129c and 129d disposed near the corner of the transparent substrate 110, and may cover the remaining two side surfaces.

In addition, when the adhesive layer 125 is exposed to the outside of the step adjustment layer 127, the insulation material layer 131 may at least partially cover the exposed adhesive layer 125. Pad regions of the unit pixel 100 may be defined by the openings 131a, 131b, 131c, and 131d of the insulation material layer 131 exposing the connection layers 129a, 129b, 129c, and 129d.

The insulation material layer 131 may be a translucent material, and may be formed of an organic or inorganic material. For example, the insulation material layer 131 may be formed of polyimide. When the insulation material layer 131 along with the step adjustment layer 127 is formed of polyimide, all of lower surfaces, side surfaces, and at least a portion of upper surfaces of the connection layers 129a, 129b, 129c, and 129d may be surrounded by the polyimide, except for the pad regions.

The insulation material layer 131 may prevent a defect from occurring in the unit pixel 100 while the unit pixel 100 is being transferred.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

FIG. 4 is a schematic cross-sectional view illustrating a displaying apparatus on which the unit pixel 100 is mounted.

Referring to FIG. 4, the unit pixels 100 are mounted on a panel substrate 1000 using a bonding material 150. The panel substrate 1000 may be replaced with a circuit board.

The connection layers 129a, 129b, 129c, and 129d exposed through the openings 131a, 131b, 131c, and 131d of the insulation material layer 131 may be bonded to the pads 130 on the panel substrate 1000 through the bonding material 150. However, the inventive concepts are not limited thereto, and eutectic bonding, epoxy bonding, or the like may be used.

The bonding material 150 may be solder for example, and after a solder paste is disposed on the pad 130 using a technology such as screen printing, the unit pixel 100 and a circuit board 110 may be bonded through a reflow process.

As described with reference to FIG. 1, the panel substrate 1000 may be formed of a material such as polyimide (PI), FR-4 glass epoxy (FR4), glass, or the like, and may include a circuit for passive matrix driving or active matrix driving. In an exemplary embodiment of the present disclosure, the panel substrate 1000 may include wirings and resistors therein, and, in another exemplary embodiment, the panel substrate 1000 may include wirings, transistors, and capacitors. In addition, the panel substrate 1000 may have pads on an upper surface thereof, which allow electrical connection to the circuit. The pads may be arranged to correspond to the connection layers 129a, 129b, 129c, and 129d in the unit pixels 100 to be mounted on the pad. In addition, a molding member may be formed on the panel substrate 1000 on which the plurality of unit pixels 100 is mounted so as to improve a contrast ratio.

Figure 5A:
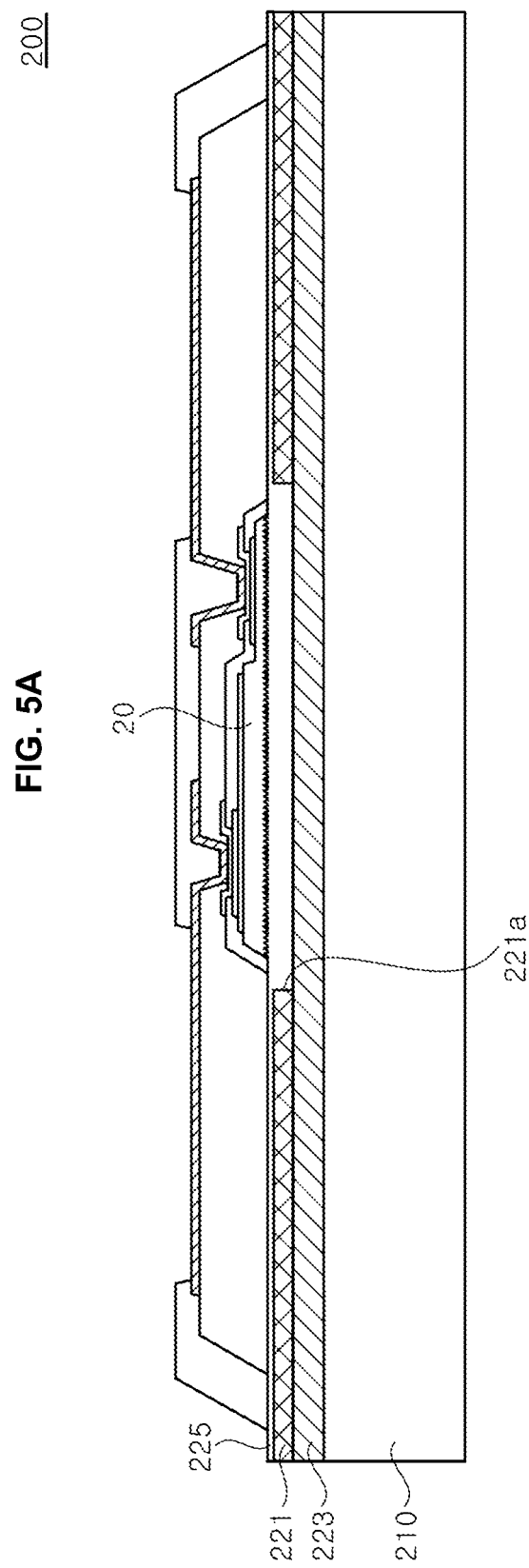
FIG. 5A is a schematic cross-sectional view illustrating a unit pixel according to another exemplary embodiment.
Figure 5B:
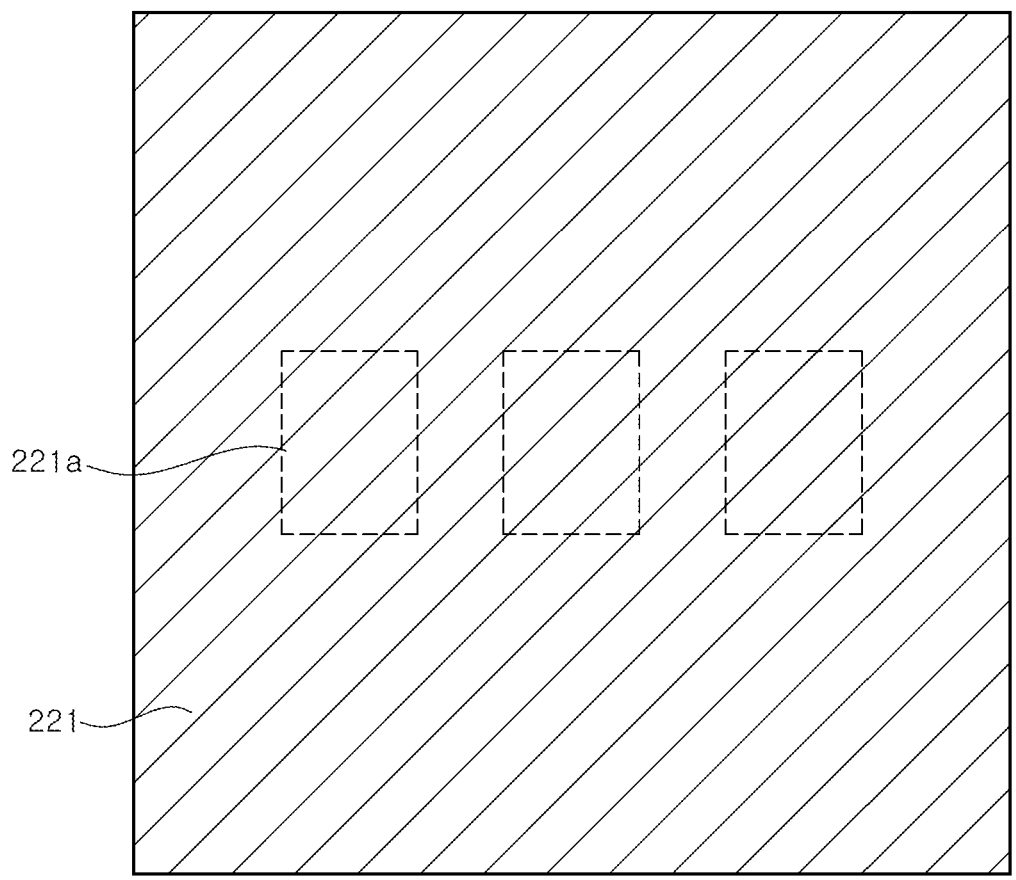
FIG. 5B is a schematic rear view illustrating a unit pixel of FIG. 5A.

FIG. 5A and FIG. 5B are a schematic cross-sectional view and a schematic rear view illustrating a unit pixel 200 according to another exemplary embodiment, respectively.

Referring to FIGS. 5A and 5B, the unit pixel 200 according to the exemplary embodiment is generally similar to the unit pixel 100 described with reference to FIGS. 3A, 3B, and 3C, except that a semi-transmissive layer 223 is disposed between a transparent substrate 210 and a light blocking layer 221. The semi-transmissive layer 223 is formed on the transparent substrate 210, and the light blocking layer 221 is formed on the semi-transmissive layer 223. The light blocking layer 221 may have windows 221a for a path of light so that light generated in the plurality of light emitting devices 20 is incident on the transparent substrate 210.

The semi-transmissive layer 223 may have substantially identical area as that of the transparent substrate 210. However, the inventive concepts are not limited thereto, and the semi-transmissive layer 223 may have an area smaller than that of the transparent substrate 210, and further, a plurality of semi-transmissive layers 223 may be disposed apart from one another corresponding to each of the windows 221a.

The semi-transmissive layer 223 extends from a lower portion of the window 221a to a lower surface of the light blocking layer 221. As described above, the semi-transmissive layer 223 may be formed to adjust transmission and reflection of light, such as a light absorbing layer or a distributed Bragg reflector.

According to the illustrated exemplary embodiment, since the light blocking layer 221 is formed on the semi-transmissive layer 223, the semi-transmissive layer 223 may be directly formed on the transparent substrate 210. As such, material layers for forming the distributed Bragg reflector may be easily formed using various deposition techniques. In addition, since the light blocking layer 221 is disposed on the semi-transmissive layer 223, the surface layer 122 as in the previous exemplary embodiment may be omitted.

Figure 6A:
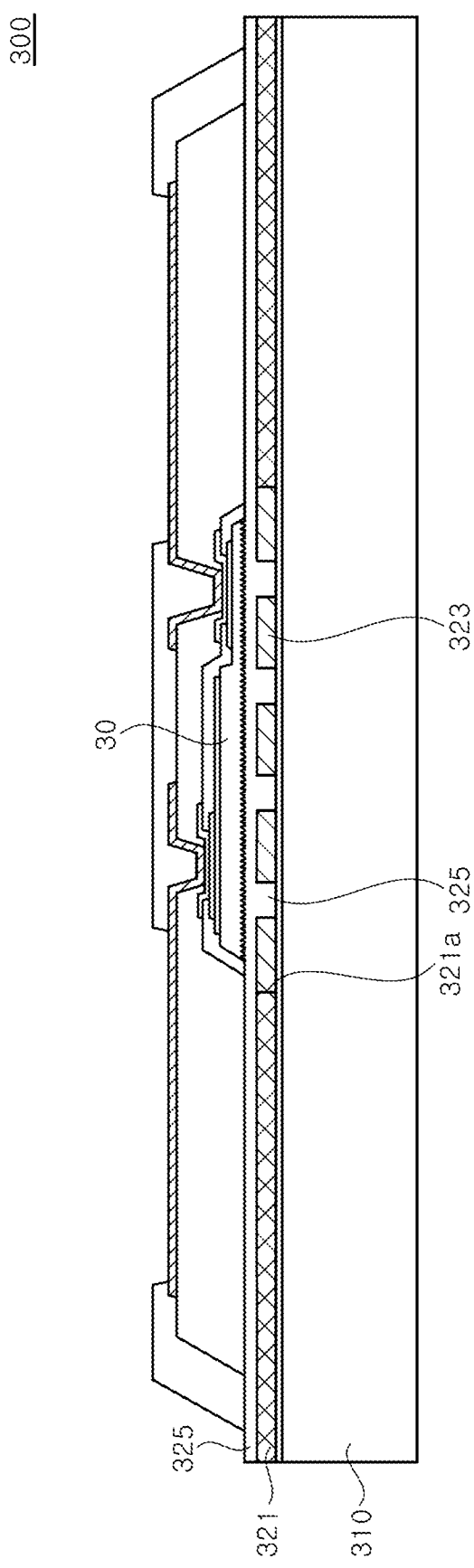
FIG. 6A is a schematic cross-sectional view illustrating a unit pixel according to another exemplary embodiment.
Figure 6B:
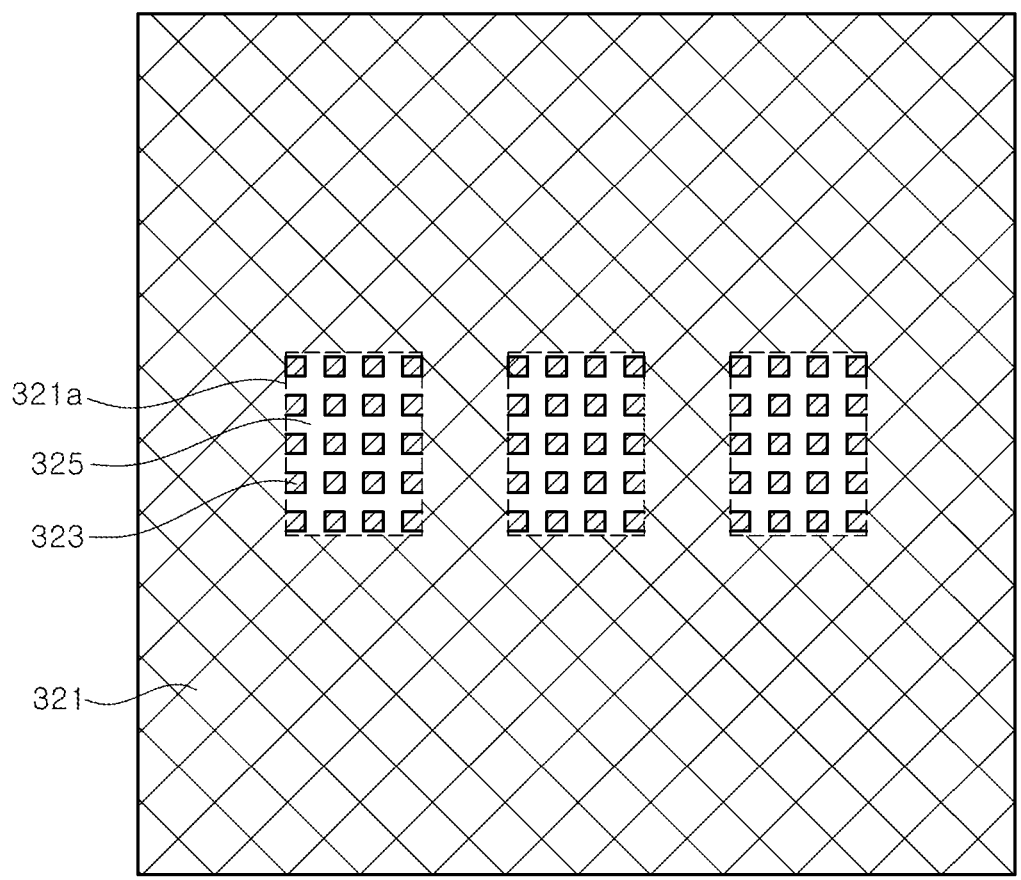
FIG. 6B is a schematic rear view illustrating a unit pixel of FIG. 6A.

FIG. 6A and FIG. 6B are a schematic cross-sectional view and a schematic rear view illustrating a unit pixel 300 according to another exemplary embodiment, respectively.

Referring to FIGS. 6A and 6B, the unit pixel 300 according to the illustrated exemplary embodiment is substantially similar to the unit pixel 100 described with reference to FIGS. 3A, 3B, and 3C. In FIGS. 6A and 6B, a semi-transmissive layer 323 is disposed in a region of a window 321a of a light blocking layer 321 and is patterned to form a plurality of islands. In addition to the island pattern, it may be patterned in a grid pattern.

The semi-transmissive layer 323 may be disposed at the same level as that of the light blocking layer 321 in the region of the window 321a, as shown in FIG. 6A. That is, the semi-transmissive layer 323 may be disposed on a transparent substrate 310 or a surface layer 322 in the same manner as the light blocking layer 321.

By disposing the patterned semi-transmissive layer 323, a light scattering effect due to the pattern of the semi-transmissive layer 323 may be induced during light extraction, and a viewing angle may be widened using this.

As illustrated in FIG. 6B, the semi-transmissive layer 323 may be disposed in the window 321a, and a region where the semi-transmissive layer 323 is patterned and removed may be filled with an adhesive layer 325. The semi-transmissive layer 323 may be patterned in square shape islands or a grid pattern, but the inventive concepts are not limited thereto and may be patterned in various shapes.

Figure 6C:
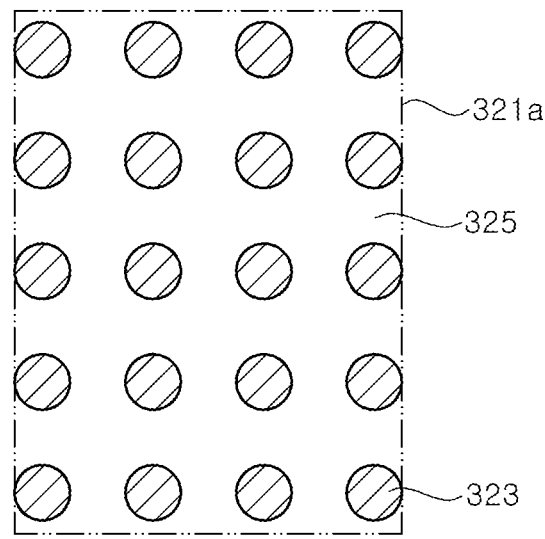
FIGS. 6C, 6D, and 6E are schematic rear views illustrating various modified examples of the unit pixel of FIGS. 6A and 6B, where.
Figure 6D:
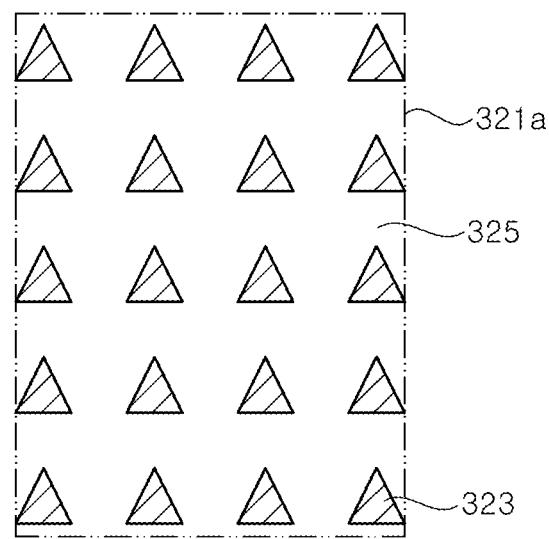
Figure 6E:
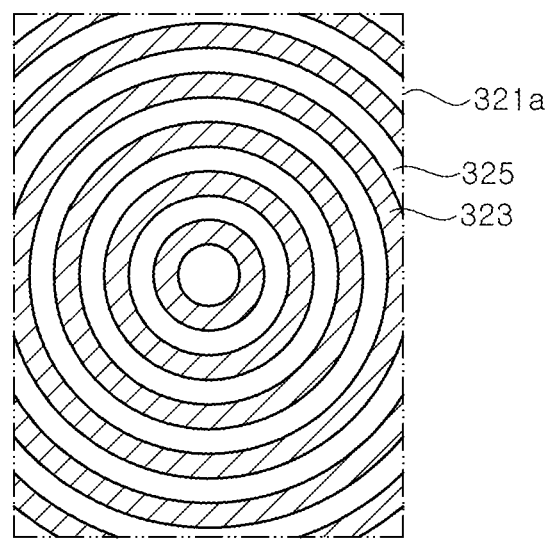

FIGS. 6C, 6D, and 6E are schematic rear views illustrating enlarged regions of the window 321a so as to describe various types of patterns.

Referring to FIGS. 6C through 6E, islands 323 may have various shapes, such as circular, triangular, or radial. Shapes, intervals, and sizes of the islands may be modified depending on a viewing angle and an amount of light. In particular, in a case of the radial shape of FIG. 6E, Fresnel effect may be expected, and reflection toward a side is stronger than that in a vertical direction, and thus, an amount of light extracted to the side may be increased. As such, a color difference depending on the viewing angle may be improved by adjusting a pattern of light emitted from light emitting devices 30.

Figure 7B:
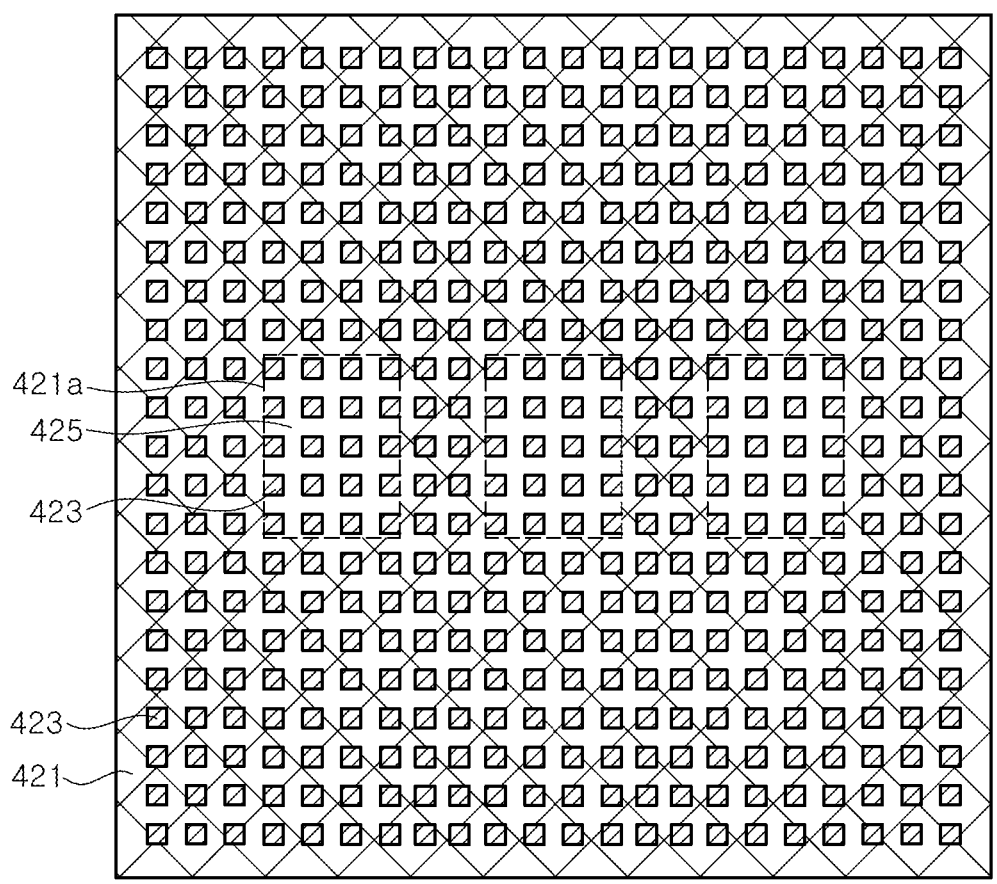
FIG. 7B is a schematic rear view illustrating a unit pixel of FIG. 7A.

FIG. 7A and FIG. 7B are a schematic cross-sectional view and a schematic rear view illustrating a unit pixel 400 according to another exemplary embodiment, respectively.

Referring to FIGS. 7A and 7B, a semi-transmissive layer 423 may be patterned in islands or grid pattern between a transparent substrate 410 and a light blocking layer 421 and disposed. The pattern of the semi-transmissive layer 423 may be formed on the light blocking layer 421, and the light blocking layer 421 may be disposed to cover the semi-transmissive layer 423. The light blocking layer 421 may have windows 421a for a path of light so that light generated in the plurality of light emitting devices 40 is incident on the transparent substrate 410.

The semi-transmissive layer 423 disposed in a region of a window 421a may be covered with an adhesive layer 425. The adhesive layer 425 may fill a region between the islands of the semi-transmissive layer 423, and cover side surfaces and upper surfaces of the islands.

The semi-transmissive layer 423 and the light blocking layer 421 may be displayed through the transparent substrate 410, and the adhesive layer 425 formed between the islands of the semi-transmissive layer 423 in the region of the window 421a may be also displayed.

The semi-transmissive layer 423 may be patterned in islands having various shapes, such as a triangle, a square, a circle, or a ring shape like the islands 323 as illustrated in FIGS. 6B-6D. Intervals and sizes of the islands may be set in consideration of a viewing angle and an amount of light.

The semi-transmissive layer 423 may reduce loss of light generated in the light emitting device 40 due to total internal reflection inside the transparent substrate 410, thereby increasing light extraction efficiency of the unit pixel.

Figure 8A:
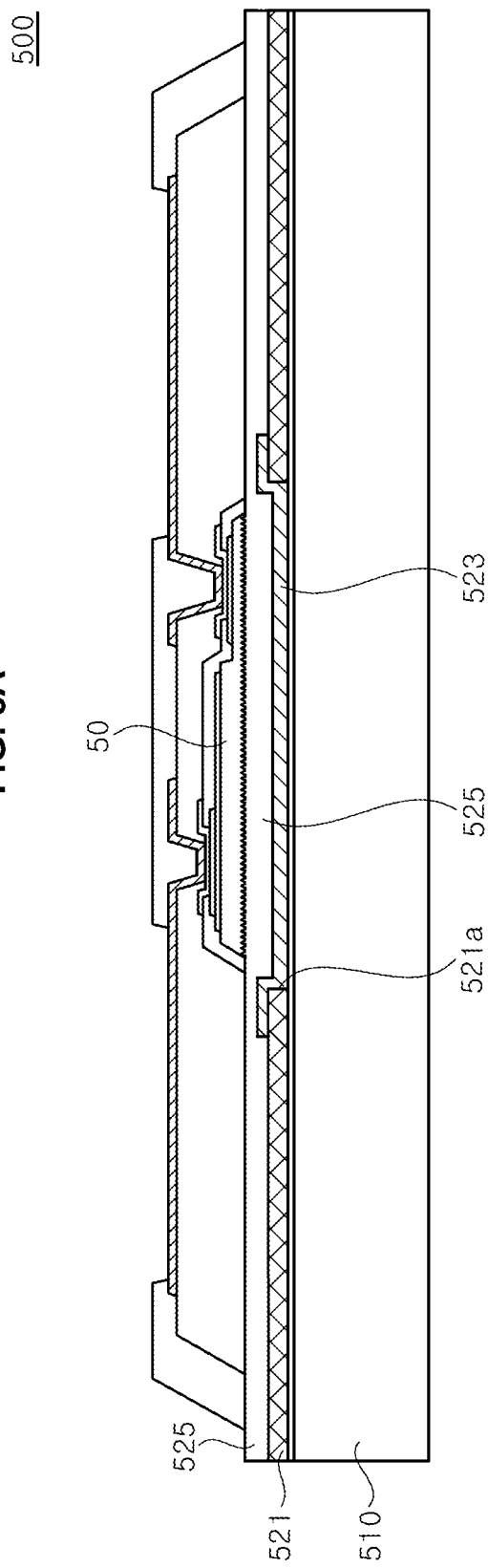
FIG. 8A is a schematic cross-sectional view illustrating a unit pixel according to another exemplary embodiment.
Figure 8B:
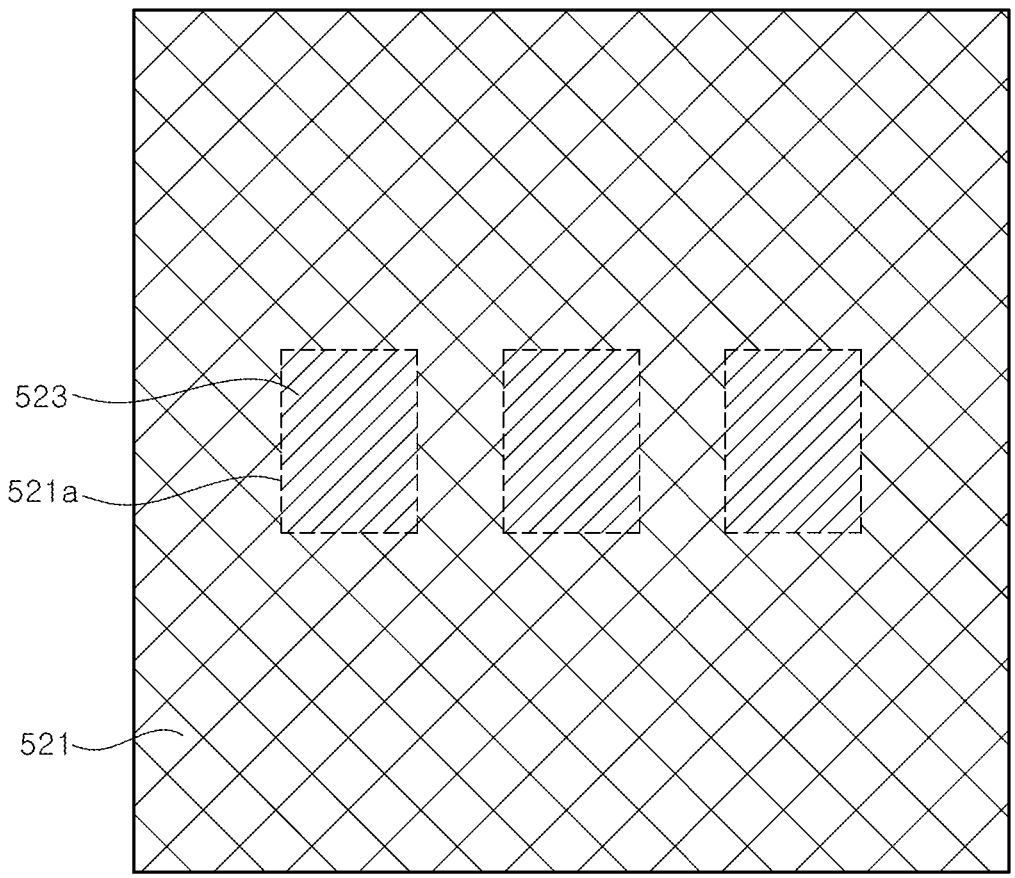
FIG. 8B is a schematic rear view illustrating a unit pixel of FIG. 8A.

FIG. 8A and FIG. 8B are a schematic cross-sectional view and a schematic plan view illustrating a unit pixel 500 according to another exemplary embodiment, respectively.

Referring to FIGS. 8A and 8B, a semi-transmissive layer 523 may extend from windows 521a to cover a portion of an upper portion of a light blocking layer 521. The semi-transmissive layer 523 formed in the windows 521a may be located lower than an upper surface of the light blocking layer 521. Meanwhile, the semi-transmissive layer 523 may be disposed corresponding to each of the windows 521a, and the semi-transmissive layers 523 may be spaced apart from one another. When viewed from a side of the transparent substrate 510, the semi-transmissive layer 523 may be displayed through the window 521a.

Figure 9:
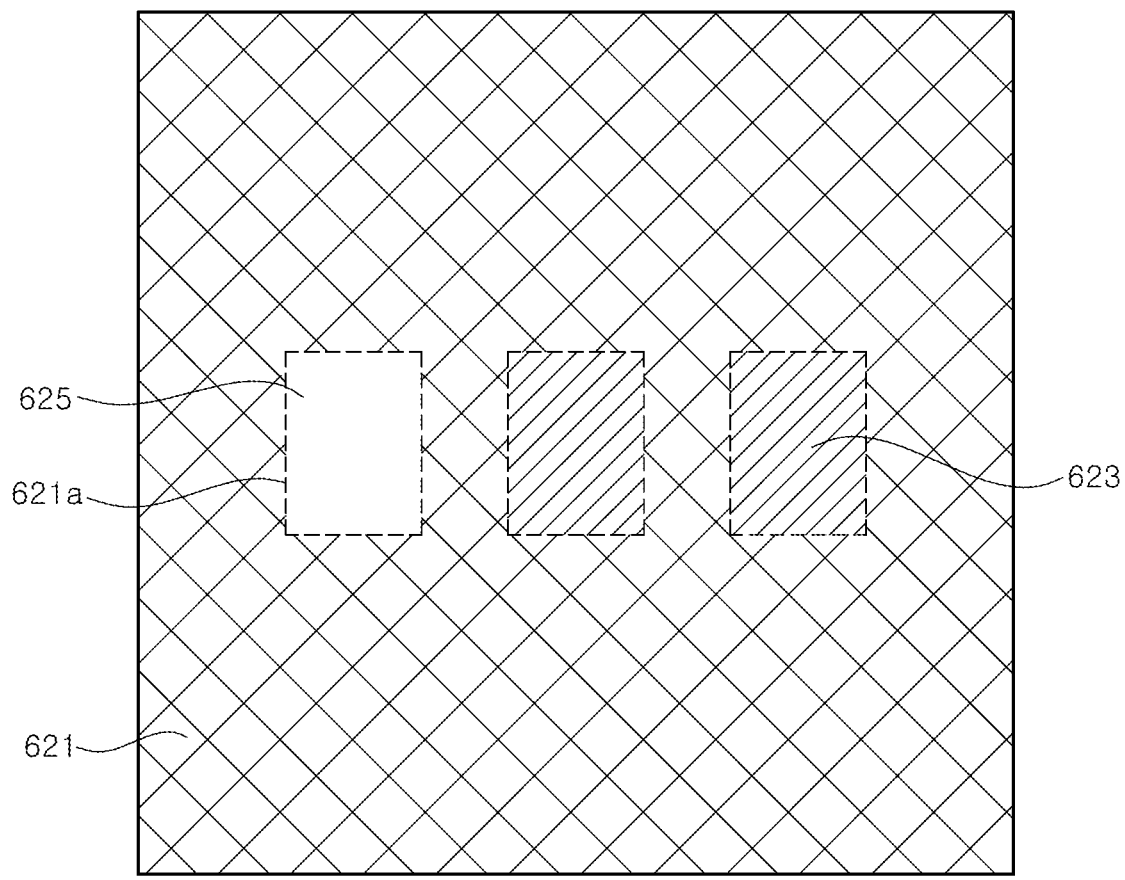
FIG. 9 is a schematic rear view illustrating a unit pixel according to another exemplary embodiment.

FIG. 9 is a schematic rear view illustrating a unit pixel 600 according to another exemplary embodiment.

Referring to FIG. 9, the unit pixel 600 according to the illustrated exemplary embodiment is substantially similar to the unit pixel 500 described with reference to FIGS. 8A and 8B, except that a semi-transmissive layer 623 is omitted in portions of windows 621a. For example, the semi-transmissive layer 623 is not formed on the window 621a in which a light emitting device 10a emitting red light is disposed, and the semi-transmissive layers 623 are disposed corresponding to light emitting devices 10b and 10c emitting green light and blue light. In the illustrated exemplary embodiment, it is described that the semi-transmissive layer 623 corresponding to the light emitting device 10a is omitted. The embodiment illustrated in FIG. 9 is by way of example, and the semi-transmissive layer 623 corresponding to the other light emitting device 10b or 10c may be omitted.

According to the illustrated exemplary embodiment, by disposing the semi-transmissive 623 corresponding to a specific light emitting device, it is possible to selectively adjust a light pattern of the light emitting device as needed among those of the light emitting devices 10a, 10b, and 10c.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:

1. A unit pixel, comprising:
   a transparent substrate;
   a plurality of light emitting devices disposed on the transparent substrate;
   a light blocking structure disposed between the transparent substrate and the light emitting devices and having at least one window; and
   a semi-transmissive structure disposed between at least one of the plurality of light emitting devices and the transparent substrate, the semi-transmissive structure arranged to overlap with at least a part of one of the at least one window, wherein the semi-transmissive structure further comprises an island pattern located within the one of the at least one window, and wherein the semi-transmissive structure extends from the window and is arranged to cover at least a portion of an upper surface of the light blocking structure.

2. The unit pixel of claim 1, wherein the semi-transmissive structure comprises a first part arranged in the window; and the first part is located lower than an upper surface of the light blocking structure relative to the transparent substrate.

3. The unit pixel of claim 1, wherein the semi-transmissive structure is formed of a material that partially absorbs light.

4. The unit pixel of claim 1, wherein the semi-transmissive structure comprises a plurality of island patterns.

5. The unit pixel of claim 1, wherein the semi-transmissive structure further comprises one or more grid patterns.

6. The unit pixel of claim 1, wherein:
   the semi-transmissive structure is disposed between the transparent substrate and a corresponding light emitting device among the plurality of light emitting devices; and
   a transmittance of the semi-transmissive structure is 70% or less with respect to light emitted from the corresponding light emitting device and vertically incident on the semi-transmissive structure.

7. The unit pixel of claim 1, wherein:
   the semi-transmissive structure is disposed between the transparent substrate and a corresponding light emitting device among the plurality of light emitting devices;
   a transmittance of the semi-transmissive structure is 50% or less with respect to light emitted from the corresponding light emitting device and vertically incident on the semi-transmissive structure.

8. The unit pixel of claim 1, wherein the semi-transmissive structure includes a distributed Bragg reflector in which material layers having different refractive indices are alternately disposed.

9. The unit pixel of claim 8, wherein the distributed Bragg reflector has a first transmittance of light incident at an incident angle of 0° and a second transmittance of light incident at an incident angle greater than 0°, the first transmittance being smaller than the second transmittance.

10. The unit pixel of claim 1, wherein the plurality of light emitting devices includes at least three light emitting devices emitting light of different colors from one another.

11. The unit pixel of claim 10, further comprising: a step adjustment layer at least partially covering the plurality of light emitting devices, and having openings exposing the plurality of light emitting devices.

12. The unit pixel of claim 1, wherein:
each of the light emitting devices comprises a light emitting structure including:
a semiconductor stack including a first conductivity type semiconductor layer,
a second conductivity type semiconductor layer, and
an active layer interposed between the first conductivity type semiconductor layer and the second conductivity type semiconductor layer; and
a first electrode pad and a second electrode pad disposed on the light emitting structure.

13. A unit pixel, comprising:
a transparent substrate;
a plurality of light emitting devices disposed on the transparent substrate, a light emitting device comprising a light emitting structure and an electrode pad;
a light blocking structure disposed between the transparent substrate and the light emitting devices and having at least one window;
a semi-transmissive structure disposed between at least one of the plurality of light emitting devices and the transparent substrate, the semi-transmissive structure arranged to overlap with at least a part of one of the at least one window, wherein the semi-transmissive structure further comprises an island pattern located within the one of the at least one window, and wherein the semi-transmissive structure extends from the at least one window and is arranged to cover at least a portion of an upper surface of the light blocking structure; and
an insulation layer disposed between the light emitting structure and the electrode pad, wherein the insulation layer includes a first distributed Bragg reflector and the semi-transmissive structure includes a second distributed Bragg reflector.

14. The unit pixel of claim 13, wherein: the second distributed Bragg reflector has a thickness smaller than a thickness of the first distributed Bragg reflector.

15. The unit pixel of claim 13, wherein a plurality of windows is formed in the light blocking layer corresponding to one or more of the plurality of light emitting devices.

16. The unit pixel of claim 15, wherein the plurality of windows is arranged side by side and spaced apart from one another such that the semi-transmissive structure arranged in each of the plurality of windows is spaced apart along with the plurality of windows.

17. A displaying apparatus, comprising:
a circuit board having pads;
a plurality of unit pixels disposed on the circuit board; and
bonding materials for bonding the plurality of unit pixels to the pads, each of the unit pixels, comprising:
a transparent substrate;
a plurality of light emitting devices disposed on the transparent substrate;
a light blocking layer disposed between the transparent substrate and the light emitting devices, and having at least one window; and
a semi-transmissive structure disposed between the light blocking layer and the transparent substrate, the semi-transmissive structure at least partially overlapping with one of the at least one window, wherein the semi-transmissive structure further comprises an island pattern located within the one of the at least one window.

18. The displaying apparatus of claim 17, wherein the semi-transmissive structure further comprises a layer that extends from the window to cover at least a portion of an upper surface of the light blocking layer.

19. The displaying apparatus of claim 17, wherein the semi-transmissive structure includes a distributed Bragg reflector in which material layers having different refractive indices are alternately disposed.

20. The displaying apparatus of claim 17, wherein the semi-transmissive structure is omitted from an area between at least one of the plurality of light emitting devices and the transparent substrate.

* * * * *